United States Patent [19]

Gulczynski

[11] Patent Number: 4,980,686
[45] Date of Patent: Dec. 25, 1990

[54] SAMPLE-AND-HOLD AMPLIFIER WITH CONTROLLABLE SOURCE CHARGER

[76] Inventor: Zdzislaw Gulczynski, P.O. Box 441, Winchester, Mass. 01890

[21] Appl. No.: 201,071

[22] Filed: May 27, 1988

Related U.S. Application Data

[63] Continuation of Ser. No. 20,781, Mar. 2, 1987, abandoned.

[30] Foreign Application Priority Data

Mar. 3, 1986 [DE] Fed. Rep. of Germany ....... 3606895

[51] Int. Cl.$^5$ ............................................. H03M 1/34
[52] U.S. Cl. .................................... 341/724; 341/122; 307/353; 328/151
[58] Field of Search ............... 341/122, 123, 124, 125, 341/138; 307/530, 352, 353; 330/9, 85, 149; 328/151; 364/178, 179

[56] References Cited

U.S. PATENT DOCUMENTS

| | | | |
|---|---|---|---|
| 4,001,812 | 1/1977 | Testa et al. ........................... | 341/124 |
| 4,573,037 | 2/1986 | Robinton et al. ........ | 340/347 AD X |
| 4,749,953 | 6/1988 | Gulczynski ............................. | 330/9 |
| 4,882,586 | 11/1989 | Dolph et al. ..................... | 341/124 X |

OTHER PUBLICATIONS

Hoeschele, Jr., Analog-to-Digital/Digital-to-Analog Conversion-, J. Wiley & Sons, 1968, pp. 357 & 358.
The Engineering Staff of Analog Devices, Inc., Analog-Digital Conversion Handbook, 6/1972, pp. II-48 to II-51; III-2 to III-5; III-10 & III-11.

*Primary Examiner*—William M. Shoop, Jr.
*Assistant Examiner*—Brian K. Young

[57] ABSTRACT

A sample & hold amplifier (SHA) is particularly for systems requiring a fast and highly accurate analog storage of a instantaneous value of an input voltage. The SHA essentially comprises a comparator, integrator and control circuit. The comparator solves the problem of an amplifier overdrive and the integrator enforces a most desirable operation of an operational amplifier. The output voltage of the integrator and the input voltage of the SHA are applied to the comparator which provides an output signal to the control circuit. The output voltage of the integrator is changing linearly. The polarity of its slope is determined by the comparator so that the integrator output voltage can reach the value of the input voltage of the SHA, and is further stored when the integration is terminated.

12 Claims, 2 Drawing Sheets

SAMPLE-AND-HOLD AMPLIFIER WITH CONTROLLABLE SOURCE CHARGER

This application is a continuation of U. S. Pat. No. 020,781, filed Mar. 2, 1987, and now abandoned.

CROSS REFERENCE TO RELATED INVENTIONS

This invention is related to: "Dual Flash Analog-to-Digital Converter" Ser. No. 316,592 filed 02/24/89;

"Dual Flash Analog-to-Digital Converter" Ser. No. 316,593 filed 02/24/89;

"Dual Flash Analog-to-Digital Converter" Ser. No. 316,594 filed 02/24/89;

"Ladderless True Flash Analog-to-Digital Converter with Automatic Calibration" Ser. No. 304,505 filed 01/31/89;

"Ultra Fast Digital-to-Analog Converter with Independent Bit Current Source Calibration" Ser. No. 304,507 filed 01/31/89;

"High Accuracy Reference Ladder" U.S. Pat. No. 4,929,848 dated 05/29/90;

"High Speed Integrating Analog-to-Digital Converter" Ser. No. 251,171 filed 07/30/88;

"Flash Analog-to-Digital Converter with Integrating Input Stage" Ser. No. 248,495 filed 09/22/88;

"High Speed Integrating Digital-to-Analog Converter" Ser. No. 198,110 filed 05/23/88;

"High Speed Instrumentation Amplifier with Minimized Offset Voltage and Drift" U.S. Pat. No. 4,829,263 dated 05/09/89;

"Digital-to-Analog Converter with Digital Correction" U.S. Pat. No. 4,843,392 dated 06/27/89;

"Flash Analog-to-Digital Converter" U.S. Pat. No. 4,763,106 dated 08/09/88;

"Dual Flash Analog-to-Digital Converter" U.S. Pat. No. 4,857,931 dated 08/15/89;

"Digital-to-Analog Converter" U.S. Pat. No. 4,811,017 dated 03/07/89;

"Digital-to-Analog Converter" U.S. Pat. No. 4,837,572 dated 06/06/89;

"Operational Amplifier" U.S. Pat. No. 4,749,958 dated 06/07/88;

"Operational Amplifier or Comparator Circuit with Minimized Offset Voltage and Drift" U.S. Pat. No. 4,749,953 dated 06/07/88;

"Operational Amplifier" U.S. Pat. No. 4,714,894 dated 12/22/87;

"Operational Amplifier" U.S. Pat. No. 4,634,996 dated 01/06/87; and

"Push-Pull Power Amplifier" U.S. Pat. No. 4,476,441 dated 10/09/84.

All inventions are by the same inventor.

BACKGROUND AND SUMMARY OF THE INVENTION

The invention relates to a sample&hold amplifier (SHA) with current source charger, particularly for systems requiring a fast and highly accurate analog storage of a instantaneous value of a input voltage.

The conventional SHAs require two operational amplifiers (OA), a capacitor, a switch and a control circuit. The capacitor is coupled to ground or the output of the SHA. A diode bridge as the switch and a charging amplifier are also used in order to reduce the acquisition time.

The conventional SHAs have a number of major disadvantages. At least one of the OAs is overdriven while closing the switch which also conducts a high and not exactly determined short circuit current. In high speed applications a thermal overload of the SHA can result which impairs its accuracy due to an increased temperature drift The employment of the nonlinear charging amplifier demands matching of the individual diodes. The invention is intended to provide an SHA including an OA always operating in a normal mode, whereby the charging and discharging currents of the capacitor are accurately predetermined. An SHA according to the present invention includes comparator means having a pair of inputs with the input signal coupled to one input, integrator means having an input and an output coupled to the other comparator means input, and control means for determining a charging current for the integrator means input in response to the input signal via the comparator means and the integrator means output via the comparator means.

The comparator solves the problem of the OA overdrive and the integrator enforces a most desirable operation of an OA. The output voltage of the integrator and the input voltage of the SHA are applied to the inputs of the comparator B having the output K coupled to a control circuit.

BRIEF DESCRIPTION OF THE DRAWINGS

The present invention will become more clear in conjunction with the accompanying figures of which.

DETAILED DESCRIPTION OF THE INVENTION

Figure 1:
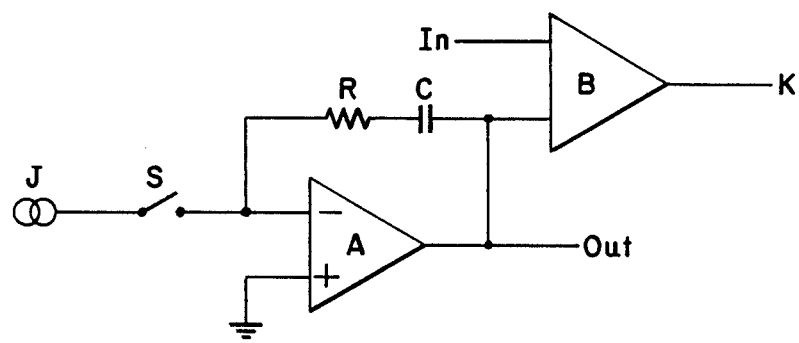
FIG. 1 is a first embodiment.

FIG. 1 is an embodiment of the present invention. The comparator B is coupled to receive the input voltage of the SHA and the output voltage of an integrator. The integrator comprises the OA A and the capacitor C. The capacitor C is included in the feedback path of the OA A, i.e. coupled between the inverting input and output thereof Closed switch S and a constant current of the current source J cause a linearly increasing capacitor voltage and the output voltage of the 0A A, whereby the voltages are equal.

The comparator B is coupled to a control circuit which determines the current direction of the current source J, so that the output voltage of the OA A can reach the value of the input voltage. When this occurs, the comparator B flips over and the switch S is opened, whereby the voltage is now stored.

The voltage drop across the resistor R with the switch S closed has an effect as an offset voltage of the comparator B. Its earlier switching results, wherein a total delay time of the 0A A, comparator B and control circuit can be considered. Upon the condition:

$$t = rc$$

the capacitor voltage reaches a value as if the delay time was zero, independently of the current value of the current source J. t, r and c are the values of the delay time, the resistor R and the capacitor C respectively.

Figure 2:
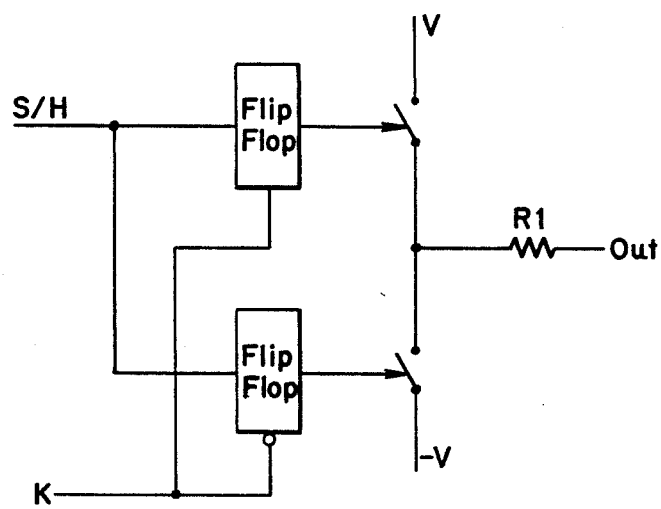
FIG. 2 is a current source and a control circuit.

FIG. 2 is a current source and a control circuit. The bipolar current source J and the switch S of FIG. 1 are provided as a controllable bipolar voltage source with a resistor R1 coupled in series therewith. Two voltage sources of opposite polarities V and −V are coupled to the resistor R1, each thru a corresponding switch.

Both flip-flops are initially reset. The sampling starts off at a positive edge of a pulse applied to the S/H input of the control circuit. One of the flip-flops is then set as enabled by the comparator B having the output K coupled to the reset inputs of the flip-flops, whereby a corresponding switch is closed. The flip-flop is reset and the switch opens when the comparator B flips over.

Figure 3:
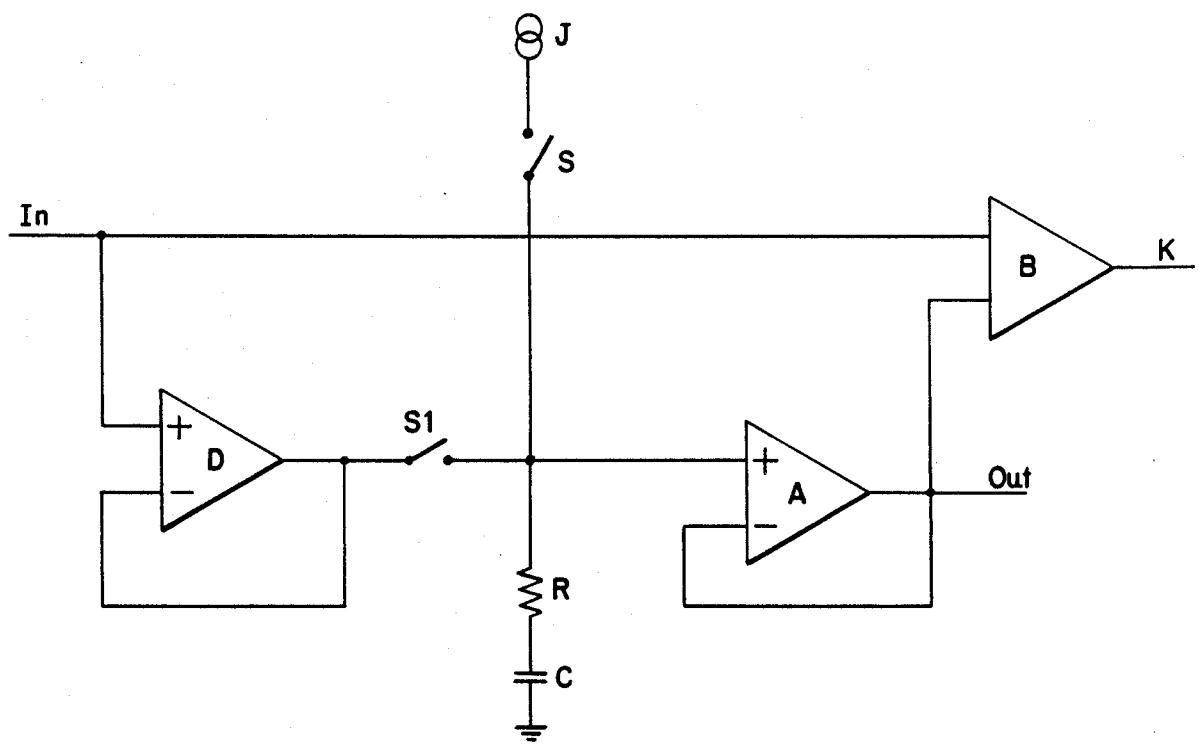
FIG. 3 is a second embodiment. Throughout the drawings, similar references denote similar parts.

FIG. 3 is a second embodiment of the present invention sharing in common the comparator B, an integrator including OA A, capacitor C, resistor R, and the current source J with switch S. The OA A is coupled as a voltage follower. The switch S is coupled to the input thereof. The capacitor C is coupled between the input and ground. Also included is another voltage follower D having an input coupled to the input signal and an output coupled to the integrator input via the switch S1. Similarly, the output of the voltage follower D may alternately be coupled to the other terminal of the resistor R. The voltage follower D provides an additional charging current for the integrator after switch S opens. This enables tracking of the input signal by the SHA.

The employment of the comparator B is of a special advantage for an automatic offset error correction. The comparator B should oscillate when the input voltage is zero and the capacitor C is shorted out. This can be easily detected and possibly adjusted by a compensation of the offset voltage of the OA A and/or comparator B.

A real comparator has a significantly higher response time at a small input overdrive. This can be bypassed thru an employment of a window comparator for sampling the differential input voltage of the comparator B. A too small voltage can be increased by recharging the capacitor C before the actual sampling begins. The comparator B is then definitely driven into a saturation, whereby the response time is known. The accuracy of the window comparator is not critical.

Similarly, the acquisition time can be estimated A monoflop which is fired on the beginning of a new sampling can be employed. If the comparator B flips over too soon, the differential input voltage was too small and the switch S remains closed. The monoflop is retriggered and determines when the current direction is reversed. The switch S is opened when the comparator B flips over again.

The embodiments of the present invention described herein are intended to be taken in an illustrative and not a limiting sense. Various modifications and changes may be made to these embodiments by persons skilled in the art without departing from the scope of the present invention as defined in the appended claims.

What I claim is:

1. Sample and hold amplifier for storing a sample of input signal and providing output signal, comprising:
    a comparator means for comparing the input signal against the output signal and providing a control signal in response thereto;
    a source means for providing a current;
    a switch means coupled in series with the source means for terminating the current thereof;
    a capacitive means for integrating the current and storing the sample of the input signal when the current is terminated; and
    an output means for providing the output signal in response to a voltage appearing across the capacitive means,
    wherein the source means includes a control means for determining direction of the current in response to the control signal for causing the output means to provide the output signal in the direction approaching the input signal.

2. Sample and hold amplifier of claim 1 wherein the output means includes an operational amplifier having a noninverting input coupled to ground, an inverting input coupled to the switch means, and an output providing the output signal, and
    further wherein the capacitive means is coupled between the inverting input and output of the operational amplifier.

3. Sample and hold amplifier of claim 1 wherein the capacitive means is coupled to ground.

4. Sample and hold amplifier of claim 3 further comprising: an amplifier means for sensing the input signal and providing an output voltage in response thereto; and
    a second switch means for applying the output voltage across the capacitive means.

5. Sample and hold amplifier of claim 3 wherein the output means includes an amplifier means for sensing the voltage across the capacitive means and providing the output signal.

6. Sample and hold amplifier of claim 1 wherein the source means includes:
    a pair of voltage sources;
    a resistive means for attaining the current; and
    a second switch means for coupling one of the voltage sources in series with the resistive means in response to the control means.

7. Sample and hold amplifier of claim 1 wherein the source means includes a controllable current source.

8. Sample and hold amplifier of claim 1 wherein the capacitive means includes a capacitor and a resistor coupled in series therewith.

9. Sample and hold amplifier for storing a sample of input signal and providing output signal, comprising:
    a comparator means for comparing the input signal against the output signal and providing a control signal in response thereto;
    a source means for providing a current;
    a switch means coupled in series with the source means for terminating the current thereof;
    a capacitive means for integrating the current and storing the sample of the input signal when the current is terminated; and
    an output means for providing the output signal in response to a voltage appearing across the capacitive means, and including an operational amplifier having a noninverting input coupled to ground, an inverting input and output, wherein the capacitive means is coupled therebetween, and
    further wherein the source means includes a control means for determining direction of the current in response to the control signal for causing the output means to provide the output signal in the direction approaching the input signal.

10. Sample and hold amplifier of claim 9 wherein the source means includes:
    a pair of voltage sources;
    a resistive means for attaining the current; and
    a second switch means for coupling one of the voltage sources in series with the resistive means in response to the control means.

11. Sample and hold amplifier of claim 9 wherein the source means includes a controllable current source.

12. Sample and hold amplifier of claim 9 wherein the capacitive means includes a capacitor and a resistor coupled in series therewith.

* * * * *